United States Patent
Mohamed et al.

(10) Patent No.: US 7,117,128 B2
(45) Date of Patent: Oct. 3, 2006

(54) METHOD AND APPARATUS FOR DIGITAL SIGNAL FILTERING

(75) Inventors: Magdi A. Mohamed, Schaumburg, IL (US); Weimin Xiao, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 29 days.

(21) Appl. No.: 10/854,836

(22) Filed: May 27, 2004

(65) Prior Publication Data

US 2005/0278150 A1    Dec. 15, 2005

(51) Int. Cl.
    *G06F 15/00*    (2006.01)
(52) U.S. Cl. .................. 702/190; 702/199; 706/22; 324/76.28; 708/300; 381/71.11; 380/208
(58) Field of Classification Search ........ 702/189–195, 702/199; 706/22; 324/76.28; 708/300; 381/71.11; 380/208
    See application file for complete search history.

(56) References Cited

U.S. PATENT DOCUMENTS

| | | | | |
|---|---|---|---|---|
| 4,438,504 A | * | 3/1984 | Favin | ......................... 708/322 |
| 4,893,316 A | * | 1/1990 | Janc et al. | .................. 708/300 |
| 5,576,497 A | * | 11/1996 | Vignos et al. | ........... 73/861.22 |
| 6,671,663 B1 | * | 12/2003 | Hellums et al. | ............... 703/14 |
| 2004/0012433 A1 | * | 1/2004 | Kim et al. | ................... 327/350 |

OTHER PUBLICATIONS

Dulger et al., 'A 1.3 V, 5mW Fully Integrated Tunable Bandpass Filter at 2.1 GHz in 0.35 um CMOS', Jun. 2003, IEEE Publication, vol. 38, No. 6, pp. 918-928.*
Corredoura et al., 'Low Level RF System Design for the PEP-II B Factory', 1996, Standford Publication, pp. 1-3.*
Hocaoglu et al., 'Nonlinear Filters for Target Detection in LADAR Range Images', Sep. 1997, IEEE Article, pp. 177-182.*
Diamond, 'Calibration of an Audio Frequency Noise Generator', Jun. 1966, IEEE Publication, vol. au-14, No. 2, pp. 96-100.*
Mohamed, M.; Xiao, W.; "Q-Measures: An Efficient Extension of the Sugeno λ-Measure" IEEE Trasnactions on Fuzzy Systems, vol. 11 No. 3 Jun. 2003.

* cited by examiner

*Primary Examiner*—Marc S. Hoff
*Assistant Examiner*—Elias Desta (57) ABSTRACT

A Q-Filter is a reconfigurable technique that performs a continuum of linear and nonlinear filtering operations. It is modeled by unique mathematical structure, utilizing a function called the Q-Measure, defined using a set of adjustable kernel parameters to enable efficient hardware and software implementations of a variety of useful, new and conventional, filtering operations. The Q-Measure is is based on an extension of the well-known Sugeno λ-Measure.

12 Claims, 5 Drawing Sheets

METHOD AND APPARATUS FOR DIGITAL SIGNAL FILTERING

FIELD OF THE INVENTION

The present invention relates generally to filtering techniques, and in particular, to a method and apparatus for digital signal and image filtering operations.

BACKGROUND OF THE INVENTION

Digital filtering is essential to most signal processing and image understanding applications. There are several existing techniques including linear operators such as average filters and weighted average filters, and nonlinear operators such as median filters, weighted median filters, morphological filters and stack filters. In practice, the difficulty of signal filtering is not only due to the fact that there are several filtering methods, algorithms, and parameter settings, but also the complexity of discovering the most appropriate sequence of these existing filters. It would be beneficial if a computationally efficient signal processing technique can be realized that can represent several conventional linear and nonlinear filters by adjusting a set of parameters. Such a filtering technique would allow for the elimination of expensive sequences of conventional filtering operations. Moreover, from a hardware point of view, it is desired to have a unique architecture that can be used to accelerate the execution of different filters. Therefore, a need exists for a method and apparatus for filtering a signal that is computationally efficient, and allows for the elimination of expensive sequences of conventional filtering operations.

DETAILED DESCRIPTION OF THE DRAWINGS

In order to address the above-mentioned need, an efficient class of novel nonlinear filters, referred to as Q-Filters are introduced. The Q-Filter is a reconfigurable technique that performs a continuum of linear and nonlinear filtering operations. It is modeled by unique mathematical structure, utilizing a function called the Q-Measure, defined using a set of adjustable kernel parameters to enable efficient hardware and software implementations of a variety of useful, new and conventional, filtering operations. The Q-Measure is based on an extension of the well-known Sugeno $\lambda$-Measure.

Q-Filters are particularly appropriate for hardware implementation and can be trained to replace sequences of conventional linear and nonlinear filtering operations, automatically. A distinctive characteristic of the Q-Filter is its low computational complexity, which makes it appropriate for intelligent applications running on low-power and small-size devices. Q-Filters can enable efficient implementation of new computational intelligence applications on embedded devices, desktop, or base-station platforms. In this application, we present a full description of the fundamental concepts, definitions, formulations, algorithms and architecture of the Q-Filter technique.

The present invention encompasses a method for filtering a signal. The method comprising the steps of determining a value of a variable parameter $\lambda$, determine a density generator vector $f=\{f^1, f^2, \ldots, f^n\}$, constructing a q-measure based on the variable parameter $\lambda$ and vector $f$, and filtering the signal based on the q-measure.

The present invention additionally encompasses a filter comprising an input receiving a signal, an input receiving a variable parameter $\lambda$, an input receiving a density generator vector $f=\{f^1, f^2, \ldots, f^n\}$, and logic circuitry and memory components required for constructing a q-measure based on the variable parameter $\lambda$ and vector $f$ and outputting a filtered signal based on the q-measure.

Prior to describing a method and apparatus for filtering in accordance with the preferred embodiment of the present invention the following text and equations are provided to set the necessary background for utilization of the preferred embodiment of the present invention.

A conventional Sugeno $\lambda$-measure was found to be very useful in many pattern recognition and computer vision applications such as automatic target recognition, handwriting recognition, nonlinear image filtering, and multiple classifier fusion techniques. The Sugeno $\lambda$-measure is a parametric fuzzy measure that is usually used with a Fuzzy Integral such as Sugeno Fuzzy Integral or Choquet Fuzzy Integral as one choice for a fuzzy measure. Fuzzy Integrals are nonlinear functionals used to combine multiple sources of uncertain information. They are defined with respect to fuzzy measures.

The key property of a fuzzy measure is monotonicity with respect to set inclusion. In addition to this property, the Sugeno $\lambda$-measure is a non-decreasing function with respect to the values of the measure of the constituent singleton sets called the densities. Another useful characteristic of the $\lambda$-measure is that a measure of any set can be constructed from the measures of any two partitions of the given set using the same $\lambda$-rule. Finding the unique value of the parameter $\lambda$, requires finding a root of high-order polynomial in $\lambda$. When the number of densities (fuzzy measures of the singleton sets) is large, computing $\lambda$ becomes very time consuming. We present a formulation of the proposed class of fuzzy measures, for which there is no need for solving a polynomial in $\lambda$. This not only facilitates speedup of computations, but also provides flexibility in choosing a suitable value for $\lambda$ so that we can construct a belief, plausibility, or probability measure as we desire. Therefore, in principle, with a new formulation, $\lambda$ is a variable that can be manually adjusted or automatically learned using a training data set.

A new class of fuzzy measures is introduced below, which is identified as q-measures. These q-measures are based on a modification of the definition of the Sugeno $\lambda$-measure. The modification addresses an important issue. The Sugeno $\lambda$-measure has always been applied by determining the fuzzy density first, to compute a unique value of the parameter $\lambda$. In practice, that is not a plausible strategy, because values provided by experts, or obtained using some computations, are at best on an interval scale, with arbitrary position of 1. Therefore, scaling of these numbers is arbitrary, and computing $\lambda$ from these numbers is then meaningless. The proposed definition for the q-measure, which is a normalization of $\lambda$-measures, efficiently solves this critical problem. The q-measure formulation de-correlates $\lambda$ and the density.

The following discussion includes both the original definition of the Sugeno λ-measure and the proposed definition of the q-measures. Necessary background material is included to make the motivation for our modification clear. A review description of the λ-measure and its properties is provided along with a discussion of implementation issues for constructing the λ-measure. A description of the formulation of a proposed class of fuzzy measures and their basic properties is then provided. Then an iterative algorithm for constructing q-measures is provided that is guaranteed to converge to a fixed fuzzy measure. Finally a proposed filter design is provided.

Sugeno λ-Measure

The additivity axiom of classical measure theory characterizes well some types of measurements under idealized, error-free conditions. However, this axiom is not fully adequate to characterize most measurements under real, physical conditions, when measurement errors and ambiguities are unavoidable. Moreover, some measurements involving subjective or non-repeatable experiments are intrinsically non-additive.

Fuzzy measures, according to Sugeno, are defined by replacing the additivity axiom of classical measures with weaker axioms of monotonicity (with respect to set inclusion) and continuity formally as follows:

Let X be an arbitrary set and $\Omega$ be a sigma-algebra of subsets of X. A set function $g: \Omega \rightarrow [0,1]$ defined on $\Omega$ which satisfies the following three axioms, is called a fuzzy measure.

Boundary Conditions $g(\Phi) = 0, g(X) = 1.$ (1)

Monotonicity. If $A, B \in \Omega$ and $A \subset B$, then $g(A) \le g(B).$ (2)

Continuity. If $F_n \in \Omega$ for $1 \le n < \infty$ and the sequence $\{F_n\}$ is monotone, in the sense of inclusion, then
$$\lim_{n\to\infty} g(F_n) = g(\lim_{n\to\infty} F_n).$$ (3)

According to the definition of a fuzzy measure, g, the measure of the union of two disjoint subsets cannot be directly computed from the component measures. In light of this, Sugeno introduced the so-called λ-measure satisfying the following additional property: for all A, B $\subset$ X with A∩B=Φ, $$g(A \cup B) = g(A) + g(B) + \lambda g(A)g(B), \text{ for some fixed } \lambda > -1$$ (4)

In a later publication by Sugeno, the value of the parameter λ is allowed to include −1 as well, i.e. $\lambda \ge -1$.

Let $X = \{x_1, x_2, \ldots, x_n\}$ be a finite set, and let $g^i = g(\{x_i\})$. The values $g^i$ are referred to as the densities of the measure g. Suppose $A = \{x_{i1}, x_{i2}, \ldots, x_{im}\} \subset X$, then we can write $$g(A) = \sum_{i=1}^{m} g^{i_j} + \lambda \sum_{j=1}^{m-1} \sum_{k=j+1}^{m} g^{i_j} g^{i_k} + \ldots + \lambda^{m-1} g^{i_1} \ldots g^{i_m}$$
$$= \left[\prod_{x_i \in A}(1 + \lambda g^i) - 1\right] / \lambda, \quad \lambda \ne 0$$ (5)

The value of the parameter λ can be found from the equation: g(X)=1, which is equivalent to solving the equation:

$$\lambda + 1 = \prod_{i=1}^{n}(1 + \lambda g^i)$$ (6)

The total sum of the values of the densities determines whether the unique real value of λ is positive, negative or zero, if the sum of the densities is less than, greater than, or equal to 1, respectively. Hence given a set of density values, we can only construct a single plausibility, belief, or probability measure using the unique real value of the constrained parameter λ.

Proposed Class of Fuzzy Measures

In many applications, the values of the densities of the λ-measure are provided by human experts according to their opinion on the worth of information sources. If the experts choose to provide values that add to 1, the unique real value of the parameter λ will be zero, and hence the λ-measure will actually be a probability measure even though this might not be the best measure for modeling the system. In reality, those values given to represent the worth of information sources are meant to represent relative "credibility measures" of the information sources. Usually experts linearly normalize their values to add to 1, without realizing the consequences of this normalization. Ideally, we should search for a suitable fuzzy measure focusing on the fact that we have relative information about the worth of the singleton information sources. In our proposed class of fuzzy measures we managed to simply and efficiently modify the definition of the λ-measure to solve this problem of resolving ambiguities in expert scores and of arbitrary scaling. An important aspect of all systems that search a large space of many potential solutions is the computational burden. We managed to satisfy the three basic fuzzy measure axioms and avoid unnecessary computations in a proper and efficient formulation.

The definition of the λ-measure is highly constrained by the uniqueness of the parameter λ computed by solving an (n−1) degree polynomial in λ. Since in many cases this can be both restrictive and expensive, we intend to avoid it in our formulation of the new class of fuzzy measures. Let us formally define our proposed class of fuzzy measures as follows:

Let $X = \{x_1, x_2, \ldots, x_n\}$ be a finite set, and let $\Omega$ be a sigma-algebra of subsets of X as before. For all given sets A, B $\subset$ X with A∩B=Φ, we define a set function $f: \Omega \rightarrow [0, \infty)$ on $\Omega$ by:

$$f(\Phi) = 0$$ (7)

$$f(A \cup B) = f(A) + f(B) + \lambda f(A)f(B), \text{ for any choice of } \lambda \ge -1$$ (8)

We call this set function, $f$, the measure generator function. Let $f^i = f(\{x_i\})$, $i = 1, \ldots, n$. Similarly, we call the values of $f^i$ the density generators. The only two constraints on the choice of the density generator values are:

$$0 \le f(\{x_i\}) \le 1, \quad i = 1, 2, \ldots, n$$ (9)

$$\sum_{i=1}^{n} f(\{x_i\}) > 0$$ (10)

The conditions (9) and (10) enforce the density generators to have values in the unit interval, with at least one of the values being strictly positive to insure proper definition of the proposed fuzzy measure. The rationale behind these requirements will be explained in the rest of this section and the next section.

Note that $f(X)$ is not necessarily equal to 1 for any choice of the variable parameter $\lambda \epsilon [-1, \infty)$. Since $f$ satisfies the monotonicity axiom in the sense of set inclusion, $f(X)$ is guaranteed to have the maximum value among the measure generator values of all possible subsets, i.e. $\forall A \subset X, f(A) \leq f(X)$.

Now, given a set of density generator values $\{f^1, f^2, \ldots, f^n\}$ that satisfy the requirements stated in (9) and (10), we define our proposed q-measure q: $\Omega \rightarrow [0,1]$ on $\Omega$ by:

$$q(A)=f(A)/f(X), \forall A \subset X \quad (11)$$

We call it a q-measure because it is defined by the above quotient of polynomials to enable quick computations. Using Equation (11), for any choice of the variable parameter $\lambda \epsilon [-1, \infty)$, we can construct a fuzzy measure. This provides a definition for a class of various fuzzy measures specified by the choice of the variable parameter $\lambda$. The Sugeno $\lambda$-measure is a special case in this class, when $\lambda$ is selected such that $f(X)=1$.

The q-measure can be constructed in a similar manner to that of the Sugeno $\lambda$-measure. We first set a value for the variable $\lambda$ greater than or equal to $-1$, regardless of the values of the density generators. Next we compute the measure generator values for all sets of interest including the whole universe i.e. $f(X)$. We finally normalize the measure generator values by $f(X)$ to obtain the q-measure values for those subsets. Filtering can then take place based on the q-measure. Obviously, we can construct a probability, belief, or plausibility measure by choosing the value of the variable $\lambda$ to be zero, negative, or positive respectively.

It is worth noting that q-measures inherit all desirable characteristics of the Sugeno $\lambda$-measure and avoid the expensive requirement of solving a polynomial in $\lambda$. This fact allows us to construct a different fuzzy measure for any choice of the variable parameter $\lambda \epsilon [-1, \infty)$ in a similar manner to that used for constructing the Sugeno $\lambda$-measure. To illustrate the effect of the factors that determine the value of a q-measure, using Equation (5), Equation (11) can be expressed as:

$$q(A) = \begin{cases} \dfrac{\prod_{x_j \in A}(1+\lambda f^j)-1}{\prod_{x_j \in X}(1+\lambda f^j)-1}, & \lambda \geq -1, \lambda \neq 0 \\ \dfrac{\sum_{x_j \in A} f^j}{\sum_{x_j \in X} f^j}, & \lambda = 0 \end{cases} \quad (12)$$

Normalizing by $f(X)$ in Equation (11) guarantees the values of $q(A)$ to be in the range $[0,1]$ due to the fact that $f(X)$ has the maximum value. It is now easy to show that the set function q: $\Omega \rightarrow [0,1]$ defined on $\Omega$ by Equation (11) does satisfy the three basic axioms of a fuzzy measure for any choice of the variable parameter $\lambda$ greater than or equal to $-1$, as follows:

Axiom 1—Boundary Conditions:
Since $f(\Phi)=0$, and $f(X)>0$, then $q(\Phi)=f(\Phi)/f(X)=0$ $q(X)=f(X)/f(X)=1$ Axiom 2—Monotonicity:
If A, B $\subset \Omega$ and A $\subset$ B, then $f(A) \leq f(B)$ by the properties of the set function $f$, $\forall \lambda \geq -1$.
Since $f(X)>0$ then $f(A)/f(X) \leq f(B)/f(X)$, hence $q(A) \leq q(B)$ Axiom 3—Continuity is satisfied since X is a finite set.

Now, to illustrate how the value of the measure generator function of a set influences the value of its constituent q-measure and the q-measure values of other sets; let A, B $\subset$ X, where:

A$\cup$B=X,

A$\cap$B=$\Phi$, $\alpha=f(A)>0$, $\beta=f(B)>0$, and $\lambda \geq -1$.

The q-measure of the sets A and B can be expressed as follows:

$$q(A)=\alpha/(\alpha+\beta+\lambda\alpha\beta) \quad (13)$$

$$q(B)=\beta/(\alpha+\beta+\lambda\alpha\beta) \quad (14)$$

Differentiating q(A) with respect to $\alpha$, $\beta$, and $\lambda$ we obtain the following expressions:

$$\partial q(A)/\partial \alpha = \beta/(\alpha+\beta+\lambda\alpha\beta)^2 > 0 \quad (15)$$

$$\partial q(A)/\partial \beta = -\alpha(1+\lambda\alpha)/(\alpha+\beta+\lambda\alpha\beta)^2 < 0, (1+\lambda\alpha)>0 \quad (16)$$

$$\partial q(A)/\partial \lambda = -\alpha^2\beta/(\alpha+\beta+\lambda\alpha\beta)^2 < 0 \quad (17)$$

The above set of derivatives describes how interdependent hypotheses can fairly compete through their constituent measure generator values in a consistent and efficient non-linear manner. An increase in the value of the measure generator of a given set results in an increase of the value of the corresponding q-measure of that set. If we apply this fact in the case where the set A is a singleton set, say $\{x_i\}$, an increase of the density generator value, $f^i$, results in an increase of the value of the fuzzy density of the q-measure of the singleton set $\{x_i\}$ and, accordingly, every set that includes it. This fact emphasizes a consistent modeling of the interdependencies among the information sources together with the non-linearity of the q-measure being controlled by the values of density generators and the variable parameter $\lambda$, resulting in a smooth monotonic behavior. A useful property of our formulation of the q-measure is that the densities of the q-measure, $q^i=q(\{x_i\})$, are also controlled by the values of the density generators of all singleton sets and the value of the variable parameter $\lambda$ as well.

Note that increasing the value of the variable parameter $\lambda$ decreases the values of the q-measure of all sets, except the universal set whose q-measure always remains equal to 1. On the other hand, decreasing the value of the variable parameter $\lambda$ increases the values of the q-measure of all sets, including the singleton sets. Hence the maximum values of the densities of the q-measure can be obtained when the value of the variable parameter $\lambda$ is set equal to $-1$. This is consistent, in a sense, with the k-measure situation where it can be easily shown, using Equation (6), that $\lambda=-1$ if and only if there exists at least one density value of the $\lambda$-measure that is equal to 1. In our proposed formulation of the q-measure, even if we set $\lambda=-1$, still we can not force the maximum density value to be equal to 1 regardless of the values of all density generators. The only situation in which the maximum density value of a q-measure is equal to 1, is when all the values of the density generators are equal to zero, except one. This property ensures that the proposed q-measure definition complies with the principle that the fuzzy measure of any set, including the singleton sets, should not be determined by simply considering only that one set regardless of the whole universe. This is a critical issue especially when we intend to find an appropriate fuzzy measure to model a complex system that manifests a high degree of interdependencies among its information sources. The q-measure approach facilitates learning proper values of the density generators and the parameter $\lambda$ in an efficient and consistent manner.

Convergence Behavior of Q-Measures

The following pseudo code defines a proposed algorithm for iteratively constructing different q-measures, given a fixed value for the parameter $\lambda$.

---

Step 1: Choose a fixed value for $\lambda \geq -1$.
Step 2: Set initial values for density generators $f(\{x_i\})$, $\forall x_i \in X$, satisfying Equation (9) & (10).
Step 3: Construct initial q-measure using initial density generators and fixed $\lambda$.
Step 4: Partition X into A, B $\subset$ X, such that A $\cup$ B = X and A $\cap$ B = $\Phi$.
Step 5: Set $\alpha$ = f(A).
Step 6: Set $\beta$ = f(B).
Step 7: Compute initial scaling factor f = $\alpha$ + $\beta$ + $\lambda\alpha\beta$.
Step 8: While (f $\neq$ 1.0) Do
    Begin
        Update $f(\{x_i\}) = f(\{x_i\})/f$, $\forall x_i \in X$.
        Re-construct a new q-measure using updated density generators and fixed $\lambda$.
        Update $\alpha$ = $\alpha$/f.
        Update $\beta$ = $\beta$/f.
        Update scaling factor f = $\alpha$ + $\beta$ + $\lambda\alpha\beta$.
    End

---

It is interesting to find that the sequence of q-measures generated by the above algorithm converges to a fixed fuzzy measure constructed using scaled values of the initial density generators and the fixed value of the parameters $\lambda$. This behavior is equivalent to finding that the sequence of the scaling factor, $f$, converges to 1.

In the rest of this section, we prove and demonstrate this interesting convergence behavior of the sequence of scaling factors generated by our proposed algorithm. The proof, constructively, includes a closed-form expression for a scaling parameter that can be used to scale the initial values of the density generators, and then use the resultant values as new density generators to directly construct the final q-measure using the same fixed (chosen) value of the parameter $\lambda$. It is not necessary to go through the algorithm iterations, if we are only interested in the finally constructed q-measure.

Generally, the intermediate constructed q-measures are more valuable than the final one since the intention is to search for an optimal measure as we discussed earlier. As in relaxation techniques, we do not have to repeat the iterations many times or until the scale factor, $f$, numerically converge to unity. We may decide to exit the loop after a few iterations by checking if the value $|f-1.0|$ is less than a small positive value, or by specifying a maximum number of iterations or computation time. The algorithm is guaranteed not to oscillate, and hence it can generate different useful q-measures that can be consumed by other system modules. Since the initial value of the scaling factor, $f$, is greater than or equal to the value of the maximum density generator, the scaled values of the density generators are guaranteed to remain in the unit interval satisfying Equation (9) and (10). The proof of the convergence of the sequence of scaling factors generated by the proposed algorithm is provided as a proof of the following theorem. The proof of this theorem is also used to verify the accuracy of the re-constructed q-measures generated by the proposed algorithm.

Convergence Theorem

Let A, B $\subset$ X, where:

$A \cup B = X$, $A \cap B = \Phi$, $\alpha = f(A)$, and $\beta = f(B)$.

$\forall \lambda \geq -1$, $\alpha \geq 0$, $\beta \geq 0$, and $\alpha+\beta > 0$; Consider the sequence:

$$f_0 = \alpha + \beta + \lambda\alpha\beta \tag{18}$$

$$f_1 = \frac{\alpha}{f_0} + \frac{\beta}{f_0} + \frac{\lambda\alpha\beta}{f_0 f_0}$$

$$f_2 = \frac{\alpha}{f_1 f_0} + \frac{\beta}{f_1 f_0} + \frac{\lambda\alpha\beta}{f_1 f_0 f_1 f_0}$$

...

$$f_{n+1} = \frac{\alpha}{f_n \cdots f_0} + \frac{\beta}{f_n \cdots f_0} + \frac{\lambda\alpha\beta}{f_n \cdots f_0 f_n \cdots f_0}$$

...

Then, the above sequence converges to unity, i.e.

$$\lim_{n \to \infty} f_n = 1 \tag{19}$$

Moreover, the product of the sequence terms can be expressed as:

$$\prod_{n=0}^{\infty} f_n = \frac{\alpha + \beta + \sqrt{(\alpha+\beta)^2 + 4\lambda\alpha\beta}}{2}, \quad \lambda \geq -1 \tag{20a}$$

$$\prod_{n=0}^{\infty} f_n = \max\{\alpha, \beta\}, \quad \lambda = -1 \tag{20b}$$

Proof of the Convergence Theorem

The cases when $\alpha=0$, $\beta=0$, or $\lambda=0$ are trivial; therefore let us exclude them from the following general case. Define $$S_n = \prod_{i=0}^{n} f_i \quad (21a)$$

$$S_0 = \alpha + \beta + \lambda\alpha\beta \quad (21b)$$

Thus, $$S_n = f_n S_{n-1} \quad (22)$$

If $S_n$ converges, i.e., $$S = \lim_{n \to \infty} S_n$$

exists, then from Equation (22), we would have $$S = f_\infty S \quad (23)$$

Thus, Equation (19) will be true, if $S \neq 0$.

Also, Equation (18) is equivalent to the following recursion:

$$S_n = \alpha + \beta + \frac{\lambda\alpha\beta}{S_{n-1}} \quad (24)$$

If the sequence $S_n$ converges, we will have $$S = \alpha + \beta + \frac{\lambda\alpha\beta}{S} \quad (25)$$

Solving the above equation for $S$, $$S = \frac{\alpha + \beta \pm \sqrt{(\alpha+\beta)^2 + 4\lambda\alpha\beta}}{2} \quad (26)$$

From Equation (18) and (21), it follows that $f_n > 0$, $S_n > 0$, when $\lambda > 0$, for all $n$. But, $$\frac{\alpha + \beta - \sqrt{(\alpha+\beta)^2 + 4\lambda\alpha\beta}}{2} < 0, \text{ when } \lambda > 0 \quad (27)$$

So, the solution is $$S = \frac{\alpha + \beta \pm \sqrt{(\alpha+\beta)^2 + 4\lambda\alpha\beta}}{2}, \text{ for all } \lambda \geq -1 \quad (28)$$

That proves Equation (20a). To prove Equation (20b), is equivalent to prove $$\lim_{n \to \infty} S_n = \max\{\alpha, \beta\}, \lambda = -1 \quad (29)$$

When $\lambda = -1$, Equation (28) becomes $$S = \frac{\alpha + \beta + |\alpha - \beta|}{2} \quad (30)$$

If $\alpha \geq \beta$, Equation (30) becomes $$S = \frac{\alpha + \beta + \alpha - \beta}{2} = \alpha$$

If $\alpha < \beta$, Equation (30) becomes $$S = \frac{\alpha + \beta + \beta - \alpha}{2} = \beta.$$

Thus, $S = \max\{\alpha, \beta\}, \lambda = -1$

Therefore, Equations (20a) and (20b) are true, if the sequence $S_n$, converges. To prove the convergence of $S_n$, under the condition $\lambda > 0$, assume that $\beta \geq \alpha$ (i.e. $\beta \neq 0$, since $\alpha + \beta > 0$). Divide Equation (24) by $\beta$, and expand it as a continued fraction:

$$\frac{S_0}{\beta} = \frac{\alpha}{\beta} + 1 + \lambda\alpha \quad (31)$$

$$\frac{S_1}{\beta} = \frac{\alpha}{\beta} + 1 + \cfrac{\lambda\frac{\alpha}{\beta}}{\frac{\alpha}{\beta} + 1 + \lambda\alpha}$$

$$\frac{S_2}{\beta} = \frac{\alpha}{\beta} + 1 + \cfrac{\lambda\frac{\alpha}{\beta}}{\frac{\alpha}{\beta} + 1 + \cfrac{\lambda\frac{\alpha}{\beta}}{\frac{\alpha}{\beta} + 1 + \lambda\alpha}}$$

...

Denote $a = \frac{\alpha}{\beta}, \beta \neq 0 \quad (32)$

We have the expression:

$$K = \frac{S}{\beta} = a + 1 + \cfrac{\lambda a}{a + 1 + \cfrac{\lambda a}{a + 1 + \cfrac{\lambda a}{a + 1 + \ldots}}} \quad (33)$$

$$= a + 1 + \cfrac{1}{\cfrac{a+1}{\lambda a} + \cfrac{1}{a + 1 + \cfrac{1}{\cfrac{a+1}{\lambda a} + \ldots}}}$$

-continued $$\text{Denote } b = \frac{a+1}{\lambda a}, \lambda \neq 0 \qquad (34)$$

Equation (33) can be expressed as $$K = a + 1 + \cfrac{1}{b + \cfrac{1}{(a+1) + \cfrac{1}{b + \ldots}}} \qquad (35)$$

K exists when $(\alpha+1), b > 0$, which is true when $\alpha, \beta, \lambda > 0$. Thus, S exists under these conditions, and Equation (28) is true.

Now consider the case when $0 > \lambda \geq -1$. Represent the sequence in Equation (33) as follows:

$$K_0 = a + 1 \qquad (36)$$

$$K_1 = a + 1 + \frac{\lambda a}{a + 1} = a + 1 + \frac{\lambda a}{K_0}$$

$$K_2 = a + 1 + \frac{\lambda a}{a + 1 + \frac{\lambda a}{a+1}} = a + 1 + \frac{\lambda a}{K_1}$$

$$\ldots$$

$$K_n = a + 1 + \frac{\lambda a}{a + 1 + \frac{\lambda a}{a+1+\ldots}} = a + 1 + \frac{\lambda a}{K_{n-1}}$$

First, we prove that $K_n \geq 1$, when $\lambda \geq -1$ as follows:

$$K_0 = a + 1 \geq 1 \qquad (37)$$

$$K_1 = a + 1 + \frac{\lambda a}{K_0} = 1 + a\left(1 + \frac{\lambda}{K_0}\right) \geq 1$$

$$\ldots$$

$$K_n = a + 1 + \frac{\lambda a}{K_{n-1}} = 1 + a\left(1 + \frac{\lambda}{K_{n-1}}\right) \geq 1$$

Thus, $K_n \geq 1, \forall n \geq 0, \lambda \geq -1 \qquad (38)$

Second, we prove $K_n \leq K_{n-1}$, when $0 > \lambda \geq -1$ as follows:

$$K_1 - K_0 = a + 1 + \frac{\lambda a}{a+1} - \{a + 1\} = \frac{\lambda a}{a+1} \leq 0 \qquad (39)$$

$$K_2 - K_1 = a + 1 + \frac{\lambda a}{K_1} - \left\{a + 1 + \frac{\lambda a}{K_0}\right\} = \lambda a \frac{K_0 - K_1}{K_0 K_1} \leq 0$$

$$\ldots$$

$$K_n - K_{n-1} = a + 1 + \frac{\lambda a}{K_{n-1}} - \left\{a + 1 + \frac{\lambda a}{K_{n-2}}\right\} = \lambda a \frac{K_{n-2} - K_{n-1}}{K_{n-2} K_{n-1}} \leq 0$$

Thus, $K_n \leq K_{n-1}, \forall n \geq 1, 0 > \lambda \geq -1$

From Equation (38) and (39), $K_n$ monotonically decreases and is bounded below. Thus, $K_n$ converges, and so does $S_n$. This completes the proof of the theorem.

Now, we need to verify that the scaled versions of the initial density generator values remain in the unit interval satisfying Equation (9) and (10) to guarantee monotonic behavior of the measure generator function, and hence facilitate proper re-construction of the constituent q-measures.

From Equation (38), we have $$K_n = \frac{S_n}{\beta} \geq 1, \forall n \geq 0, \lambda \geq -1 \qquad (40)$$

Multiplying Equation (4) by $\beta > 0$, we obtain $$S_n \geq \beta, \forall n \geq 0, \lambda \geq -1 \qquad (41)$$

Since we also have $\beta \geq \alpha$, $\alpha = f(A)$, and $\beta = f(B)$, then $$S_n \geq \max_{x_i \in B}\{f(\{x_i\})\} \geq \max_{x_i \in A}\{f(\{x_i\})\}, \forall n \geq 0, \lambda \geq -1 \qquad (42)$$

$$S_n \geq \max_{x_i \in X}\{f(\{x_i\})\}, \forall n \geq 0, \lambda \geq -1 \qquad (43)$$

Therefore, we conclude that $$\frac{f(\{x_i\})}{S_n} \in [0, 1], \forall x_i \in X, n \geq 0, \lambda \geq -1 \qquad (44)$$

and $$\sum_{x_i \in X} \frac{f(\{x_i\})}{S_n} > 0, \forall n \geq 0, \lambda \geq -1 \qquad (45)$$

Equation (44) and (45) complete the proof of accuracy of the proposed algorithm.

Figure 1:
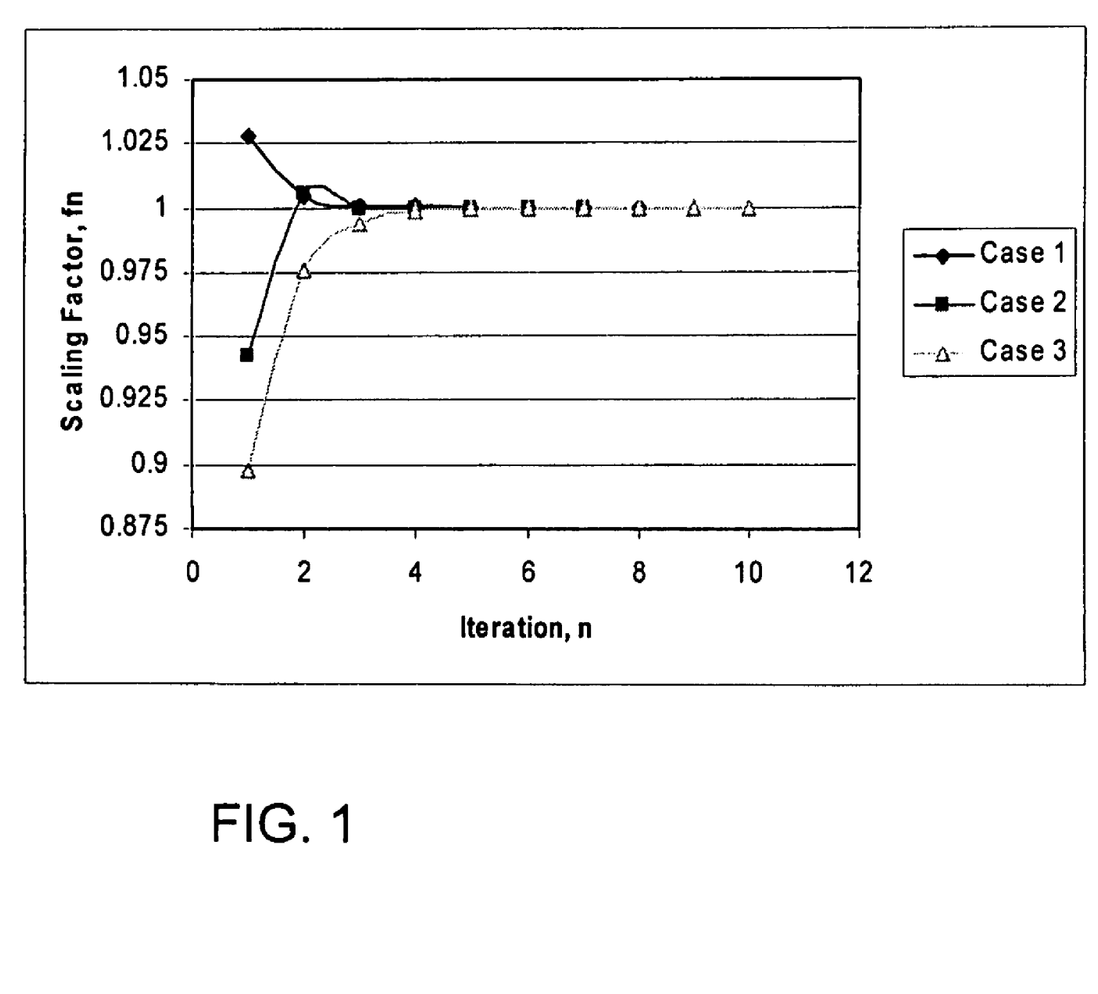
FIG. 1 illustrates the convergence behavior of the q-measures

Tables (1), (2), (3), and FIG. 1 below, numerically illustrates the convergence behavior of the q-measures having different parameters. These tables interestingly demonstrate three different cases where the sequence of the scaling factor, $f_n$, approaches unity from above, below, or both directions (bouncing above and below 1.0) after few iterations. The values of $\alpha$, $\beta$ and $\lambda$ are selected to illustrate three different convergence cases. The sequence $S_n$ numerically converges to the values given by Equation (20a) and (20b) as expected.

TABLE 1

Convergence Behavior - Case 1: $\alpha = 0.6$, $\beta = 0.8$, $\lambda = -0.5$, $S_0 = \alpha + \beta + \lambda\alpha\beta = 1.16$

| n | $\alpha/S_{n-1}$ | $\beta/S_{n-1}$ | $f_n$ | $S_n$ | $|1 - f_n|$ |
|---|---|---|---|---|---|
| 1 | 0.517241 | 0.689655 | 1.028537 | 1.193103 | 0.028537 |
| 2 | 0.50289 | 0.670520 | 1.004811 | 1.198844 | 0.004811 |
| 3 | 0.500482 | 0.667310 | 1.000803 | 1.199807 | 0.000803 |
| 4 | 0.500080 | 0.666774 | 1.000134 | 1.199968 | 0.000134 |
| 5 | 0.500013 | 0.666685 | 1.000022 | 1.199995 | 0.000022 |
| 6 | 0.500002 | 0.666670 | 1.000004 | 1.199999 | 0.000004 |
| 7 | 0.500000 | 0.666667 | 1.000001 | 1.200000 | 0.000001 |
| 8 | 0.500000 | 0.666667 | 1.000000 | 1.200000 | 0.000000 |

TABLE 2

Convergence Behavior - Case 2: $\alpha = 0.6$, $\beta = 0.8$, $\lambda = 0.5$, $S_0 = \alpha + \beta + \lambda\alpha\beta = 1.64$

| n | $\alpha/S_{n-1}$ | $\beta/S_{n-1}$ | $f_n$ | $S_n$ | $|1 - f_n|$ |
|---|---|---|---|---|---|
| 1 | 0.365854 | 0.487805 | 0.942891 | 1.546341 | 0.057109 |
| 2 | 0.388013 | 0.517350 | 1.005732 | 1.555205 | 0.005732 |
| 3 | 0.385801 | 0.514402 | 0.999431 | 1.554320 | 0.000569 |
| 4 | 0.386021 | 0.514694 | 1.000057 | 1.554408 | 0.000057 |
| 5 | 0.385999 | 0.514665 | 0.999994 | 1.554400 | 0.000006 |
| 6 | 0.386001 | 0.514668 | 1.000001 | 1.554400 | 0.000001 |
| 7 | 0.386001 | 0.514668 | 1.000000 | 1.554400 | 0.000000 |

TABLE 3

Convergence Behavior - Case 3: $\alpha = 0.1$, $\beta = 0.4$, $\lambda = -1.0$, $S_0 = \alpha + \beta + \lambda\alpha\beta = 0.46$

| n | $\alpha/S_{n-1}$ | $\beta/S_{n-1}$ | $f_n$ | $S_n$ | $|1 - f_n|$ |
|---|---|---|---|---|---|
| 1 | 0.217391 | 0.869565 | 0.897921 | 0.413043 | 0.102079 |
| 2 | 0.242105 | 0.968421 | 0.976066 | 0.403158 | 0.023934 |
| 3 | 0.248042 | 0.992167 | 0.994110 | 0.400783 | 0.005890 |
| 4 | 0.249511 | 0.998046 | 0.998533 | 0.400195 | 0.001467 |
| 5 | 0.249878 | 0.999512 | 0.999634 | 0.400049 | 0.000366 |
| 6 | 0.249969 | 0.999878 | 0.999908 | 0.400012 | 0.000092 |
| 7 | 0.249992 | 0.999969 | 0.999977 | 0.400003 | 0.000023 |
| 8 | 0.249998 | 0.999992 | 0.999994 | 0.400001 | 0.000006 |
| 9 | 0.250000 | 0.999998 | 0.999999 | 0.400000 | 0.000001 |
| 10 | 0.250000 | 1.000000 | 1.000000 | 0.400000 | 0.000000 |

As shown, the q-measure is defined to be an element of a new class of fuzzy measures based on a modified definition of the conventional Sugeno $\lambda$-measure. This proposed class of fuzzy measures includes the $\lambda$-measure as a special case, and preserves the $\lambda$-measure's desirable properties in a flexible and efficient formulation. There is no need for solving a polynomial in our formulation. This is an attractive characteristic since it both facilitates speedup of computations and provides flexibility in choosing a value for $\lambda$, so that we can construct appropriate fuzzy measures. Hence, with our proposed formulation, $\lambda$ is a relaxed parameter of choice that can be manually adjusted or automatically learned using a training procedure.

For every set, including singleton sets, the value of the q-measure is determined by considering the worth of information of all sources, as defined by Equation (12), in an increasing and consistent manner. The density values of the q-measure can be greater than, equal to, or less than their constituent density generator values, depending on the value of the measure generator of the universal set. With the Sugeno $\lambda$-measure the densities are set up front, which is against the principle that we should not be able to define the fuzzy measure of any set, including the singleton set, by considering only the elements of that set. We should not exempt the singleton sets from complying with this principle as is done with the Sugeno $\lambda$-measure and lately discover that setting the density values will determine the value of the parameter $\lambda$ and hence the whole characteristics of the fuzzy measure. Our proposed definition of the q-measure solves this problem simply and efficiently by de-correlating $\lambda$ and the density.

Although in our new formulation we fixed the definition of the measure generator function based on the $\lambda$-rule, in general any monotonic function in the sense of set inclusion can be used. As a matter of fact, if we use the sum or max of the constituent density generator values as measure generator functions we can construct a probability or possibility measure exactly as we usually do. We considered the $\lambda$-rule because of its useful properties due to the existence of a parameter that can control the degree of non-linearity. Defining a q-measure as a quotient of two values of a positive monotonic set function is an efficient way of enforcing the boundary condition of a fuzzy measure in addition to resolving the ambiguities and arbitrary scaling in scores assigned by human experts.

In the proposed formulation, even with a fixed same value for the parameter $\lambda\epsilon[-1, \infty)$, we can generate different fuzzy measures by linearly scaling the density generator values differently at a reasonable computational cost. This provides more flexibility in constructing various fuzzy measures. We provided an iterative algorithm for exploring different q-measures and provided a mathematical proof of its convergence. An extremely useful outcome of our proof is the fact that it includes a closed form expression, Equation (28), for a scaling parameter that can be used to directly scale the initial values of the density generators and use the resultant values as new density generators to construct the final q-measure using the same fixed (chosen) value of the parameter $\lambda$. It is not necessary to go through the algorithm iterations, if we are only interested in the finally constructed q-measure.

One may argue that it is possible to achieve similar results by linearly scaling the density values to construct different $\lambda$-measures for each scale. This is true in theory, but it is extremely inefficient in practice, since we have to solve for a unique value of the parameter $\lambda$ every time we consider a different scale. Even if we can afford the computation time, we will still be focusing on special cases that are already included in the proposed class of q-measures without a convincing justification for selecting the value of each scaling factor from an infinite domain.

The q-measure approach provides a more flexible scheme for constructing various useful fuzzy measures that combine simplicity, power and a certain grace of efficiency. Also, the proof of convergence, we provided, is constructive and very relevant for many practical applications.

As discussed above, it would be beneficial if a computationally efficient signal processing technique can be realized that can represent several conventional linear and nonlinear filters by adjusting a set of parameters. Such a filtering technique would allow for the elimination of expensive sequences of conventional filtering operations. In order to provide such a filter, the q-measure can be utilized to design a q-filter that represents several new and conventional linear and nonlinear filters without the need for expensive and unnecessary computations.

Q-Filters are appropriate for hardware implementation and can be trained to replace sequences of conventional linear and nonlinear filtering operations, automatically. A distinctive characteristic of the Q-Filter is its low computational complexity, which makes it appropriate for intelligent applications running on low-power and small-size devices. Q-Filters can enable efficient implementation of new computational intelligence applications on embedded devices, desktop, or base-station platforms.

Choquet Fuzzy Integral

Fuzzy integrals are nonlinear functionals used to combine multiple sources of uncertain information sources that produce noisy signals. They are defined with respect to fuzzy measures to estimate an expected value of an input function.

Existing fuzzy integral definitions include Sugeno integral, Possibility integral, and Choquet integral. The Choquet fuzzy integral provides a useful mechanism for evidence aggregation. It is a flexible method, which can represent weighted average, medians, order statistics, morphological operators, stack filters, and many other information aggregation mechanisms.

Formally, for a real-valued function, $h(x)$ on a finite set X, a Choquet fuzzy integral C of the function $h(x)$ with respect to any fuzzy measure $g(\cdot)$ is defined as follows:

$$A_\alpha = \{x|h(x) \geq \alpha\} \quad (46a)$$

Expected value of $h(x)$, $C = \int h(x) \circ g(\cdot) = \int g(A_\alpha) d\alpha$ (46b)

The Choquet integral would have a simpler form, (47c) below, if the condition (47a) is satisfied:

$$h(x_1) \leq h(x_2) \leq \ldots \leq h(x_n) \quad (47a)$$

$$A_i = \{x_i, x_{i+1}, \ldots, x_n\} \quad (47b)$$

$$C = \sum_{i=1}^{n} h(x_i)(g(A_i) - g(A_{i+1})), \quad g(A_{n+1}) = 0 \quad (47c)$$

Constructing a Choquet integral with respect to a q-measure for an input signal $h(x)$ over a given window size n, forms a Q-Filter for the input signal.

The Q-Filter

The Q-Filter is a class of nonlinear filters that is defined as a Choquet integral with respect to a q-measure over a window of observations. By adjusting the Q-Filter kernel parameters, a single Q-Filter can reshape an input signal that may require the application of many different other linear and nonlinear filters. For an input signal window $S=\{s_1, s_2, \ldots, s_n\}$, where n is the window size and $s_j = h(x_j)$, $j=1, \ldots, n$, a basic Q-Filter can be constructed using the Choquet integral, equation (46a–46b) as follows:

Set a value for the filter kernel parameter $\lambda \in [-1, \infty)$

Set an n-point density generator vector $f=\{f^1, f^2, \ldots, f^n\}$ for the input signal window $S=\{s_1, s_2, \ldots, s_n\}$, where $f^j \in [0,1]$, $j=1, \ldots, n$.

Set an m point resolution vector $R=\{r_0, r_1, \ldots, r_{m-1}\}$, where $r_0 < r_1 < \ldots < r_{m-1}$, for the input signal $S=\{s_1, s_2, \ldots, s_n\}$ with the range of signal strength, i.e., for all $s_j$, $r_{min} = r_0 \leq s_j \leq r_{m-1} = r_{max}$.

Set an (m−1) by n threshold matrix $H=\{h_{ij}\}$ where $h_{ij}=1$ if $s_j \geq r_i$, otherwise $h_{ij}=0$.

Calculate the q-measure based on the threshold matrix $H=\{h_{ij}\}$, and the density generator values, $f^j = f(\{x_j\})$, $j=1, \ldots n$, as follows:

$$F = \prod_{j=1}^{n}(1 + \lambda f^j) - 1 \quad (48a)$$

$$q_i = \frac{\prod_{j=1}^{n}(1 + \lambda h_{ij} f^j) - 1}{F} \quad (48b)$$

In the above equations, $\lambda \in [-1, \infty)$, and $\lambda \neq 0$.
When $\lambda = 0$, from Equation (8), we have:

$$F = \sum_{j=1}^{n} f^j \quad (49a)$$

$$q_i = \frac{\sum_{j=1}^{n} h_{ij} f^j}{F} \quad (49b)$$

Calculate the Choquet integral by:

$$C = \sum_{i=1}^{m-1} q_i \frac{r_{max} - r_{min}}{m-1} = \frac{r_{max} - r_{min}}{m-1} \sum_{i=1}^{m-1} q_i \quad (50)$$

The filtered signal value corresponding to the input window is then $$e = r_{min} + C. \quad (51)$$

Figure 2:
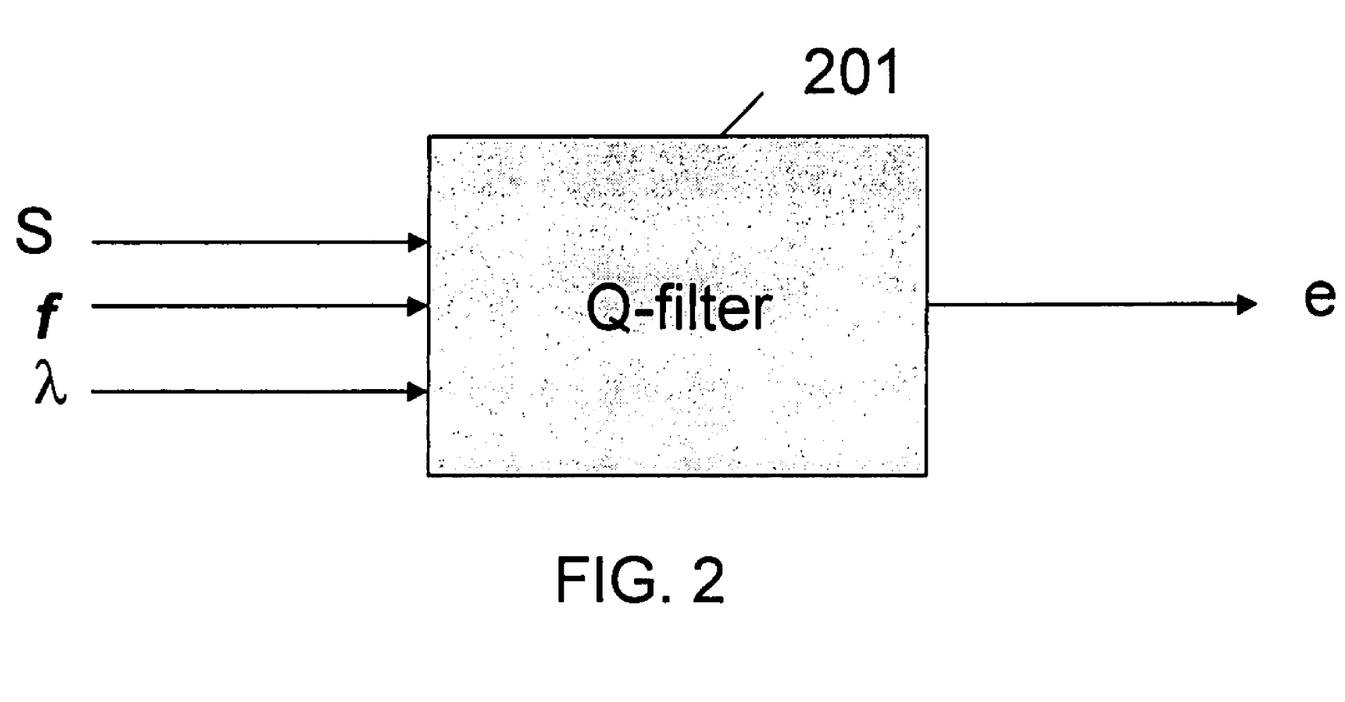
FIG. 2 is a block diagram of a Q-filter.

FIG. 2 is a block diagram of a Q-Filter 201. As shown, filter 201 comprises an input receiving a signal S to be filtered, an input receiving variable parameter $\lambda$, and an input receiving a density generator vector $f=\{f^1, f^2, \ldots, f^n\}$. During operation, the input signal window $S=\{s_1, s_2, \ldots, s_n\}$, is input into the Q-Filter 201 with e being the output computed as an expected value of the given input. More particularly, during operation the Q-Filter utilizes logic circuitry (e.g., a microprocessor controller) and memory components to construct a q-measure based on the variable parameter $\lambda$ and vector $f$, and outputs a filtered signal based on the q-measure.

The above method is suitable for hardware implementation since the basic mathematical operations are thresholding, addition and multiplication, for discrete valued input signals such as digital images or any other m-valued discrete signals that can be quantized to have values between 0 and m−1. The Q-Filter operation can be further simplified in such cases to enable efficient hardware implementation.

An m-valued Q-Filter can be constructed using threshold decomposition and a q-measure as follows. Let S be a moving window over an m-valued input signal, that is $S(t)=\{s_1, s_2, \ldots, s_n\}$, where n is the window size and the window elements are denoted by $s_j \in \{0, 1, \ldots, m-1\}$, $j=1, \ldots, n$, at time slot $t \in Z$. Form the threshold binary signals $s^{(1)}, \ldots, s^{(m-1)}$ by $$s_j^{(i)} = \begin{cases} 1 & \text{if } s_j \geq i \\ 0 & \text{otherwise} \end{cases} \quad (52)$$

The output of filtering the $i^{th}$ threshold signal $s^{(i)}$ at point t is defined by $$A_i = \{x_j | s_j^{(i)} = 1, j=1, \ldots, n\} \quad (53a)$$

$$e^{(i)}(t) = q(A_i) \quad (53b)$$

where $s_j^{(i)}$, $j=1, \ldots n$, are Boolean variables defining the crisp set $A_i$, the argument of the q-measure $q(\cdot)$ defined using a kernel of size n.

The output of the Q-Filter with respect to q(·) at point t is now:

$$e(t) = \sum_{i=1}^{m-1} e^{(i)}(t) \qquad (54)$$

where the values $e^{(i)}(t)$ of the q-measure are real values in the unit interval [0,1].

Figure 3:
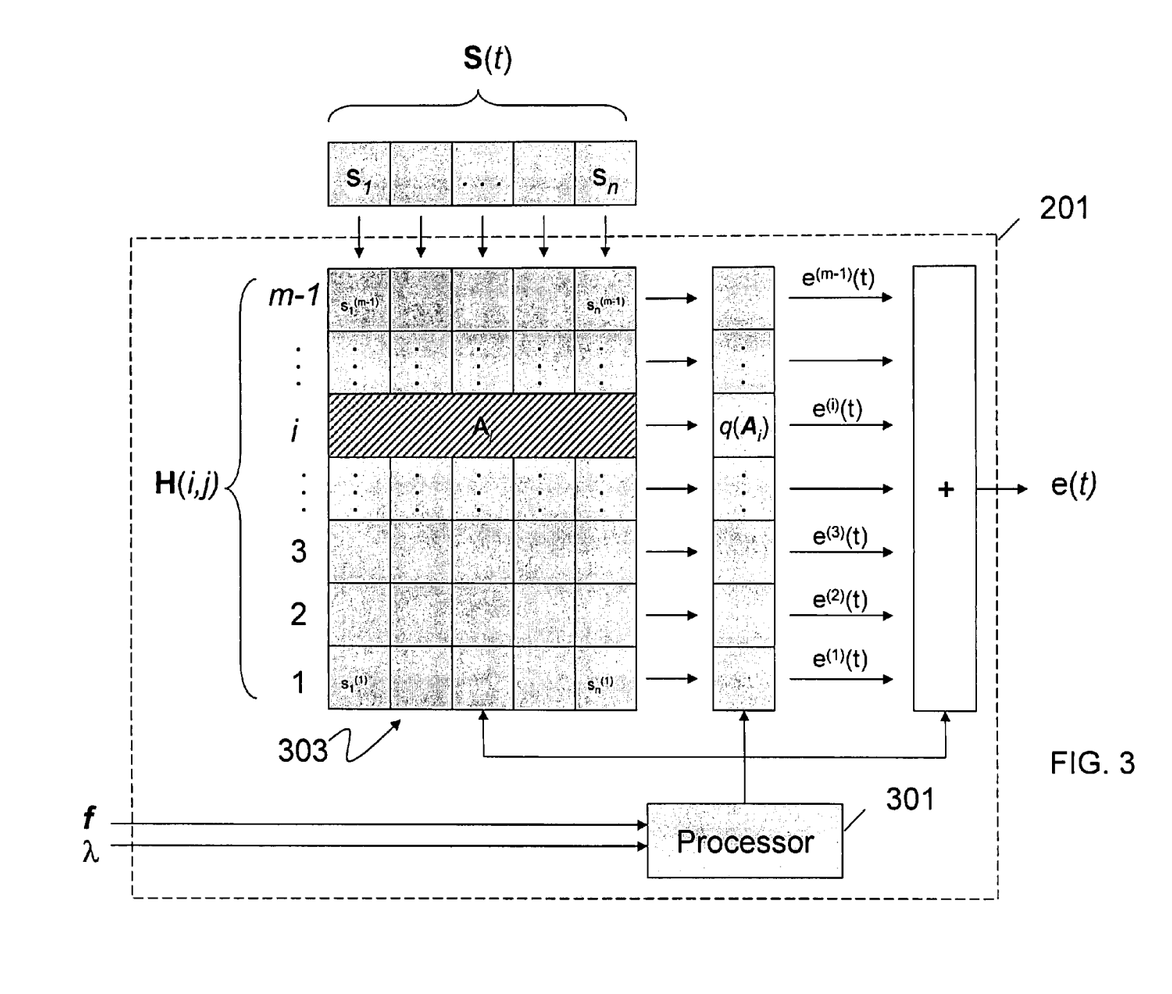
FIG. 3 is a more-detailed block diagram of a Q-filter.

The above procedure is illustrated in FIG. 3, which shows a more-detailed block diagram of a Q-filter. As shown, an m-valued input signal S(t) enters filter 201 and enters thresholder 303. Processor 301 instructs thresholder 303 to Form the m−1 threshold binary signals $s^{(1)}, \ldots, s^{(m-1)}$ as described above in equation (52), where $A_i = \{x_j | s_j^{(i)} = 1, j=1, \ldots, n\}$ is a crisp set obtained by thresholding the input signal S(t) at threshold value i. Thresholder 303 outputs $A_i$ and processor 301 constructs $e^{(i)}(t)$ for each threshold value by computing the q-measure of the crisp set $A_i$. More particularly $e^{(i)}(t) = q(A_i)$ as defined in equation (53b). The values for $e^{(i)}(t)$ are summed to produce e(t).

Figure 4:
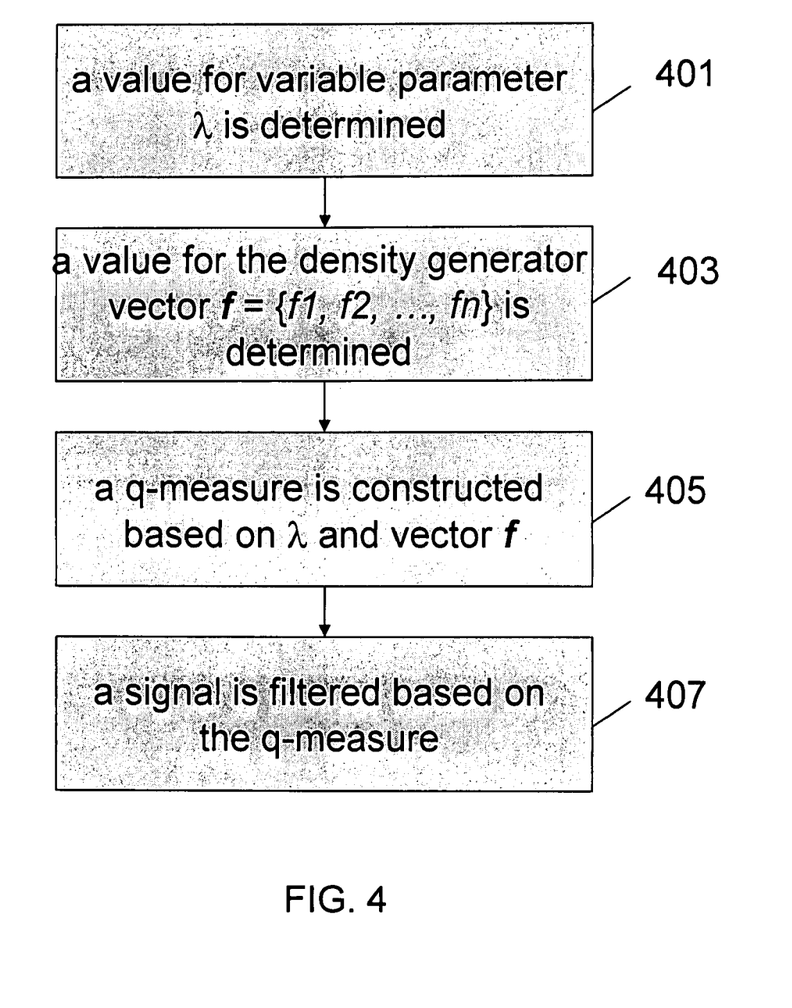
FIG. 4 is a flow chart showing operation of the Q-filter.

FIG. 4 is a flow chart showing operation of the Q-filter of FIG. 3. The logic flow begins at step 401 where a value for variable parameter λ is determined. At step 403 a value for the density generator vector $f = \{f^1, f^2, \ldots, f^n\}$ is determined and a q-measure is constructed based on λ and vector f (step 405). Finally, at step 407 a signal is filtered based on the q-measure.

Figure 5:
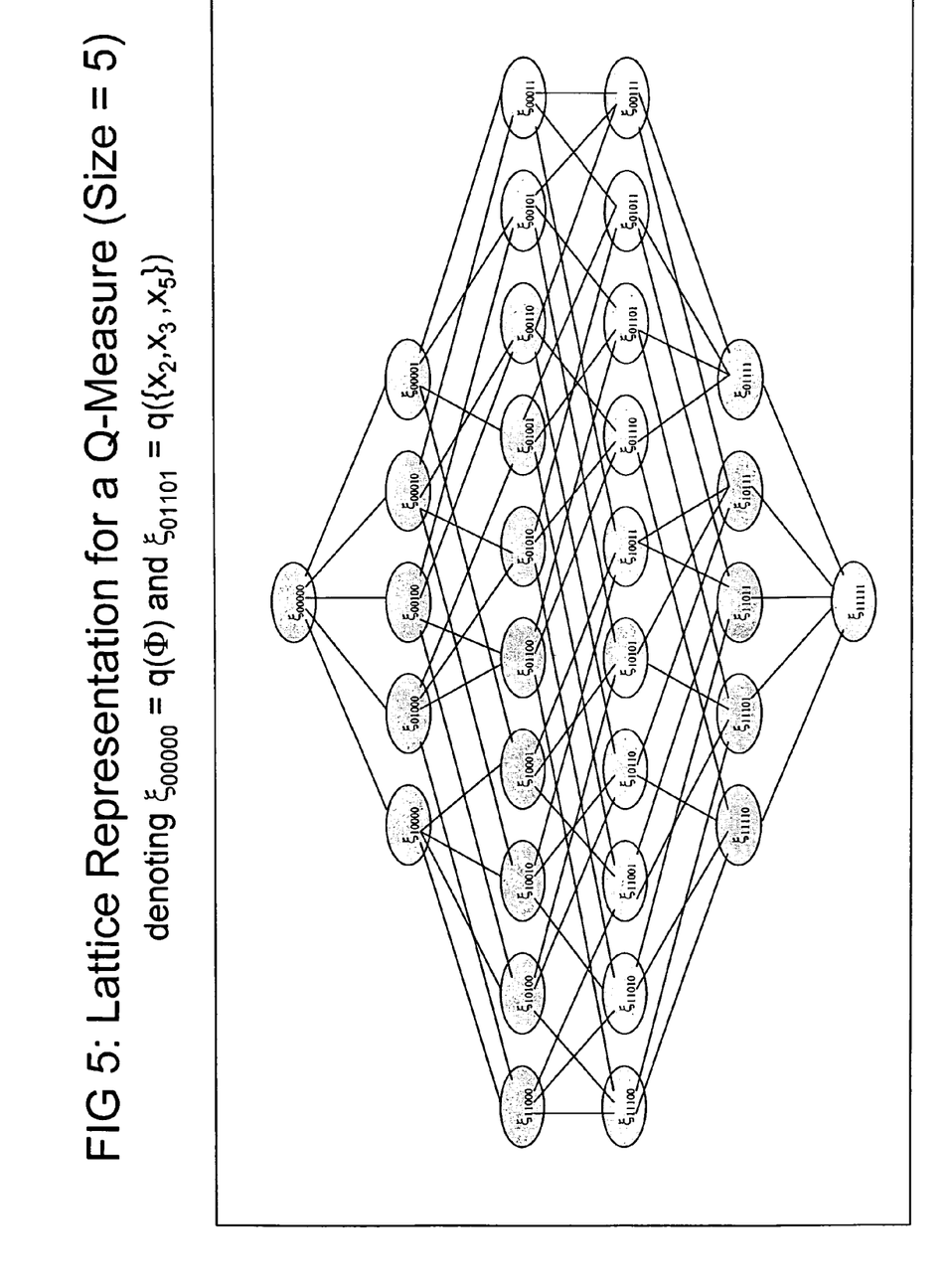
FIG. 5 illustrates a data structure that can be used for efficient pre-saving and accessing of the q-measure components, given a small widow of size n=5.

While the invention has been particularly shown and described with reference to a particular embodiment, it will be understood by those skilled in the art that various changes in form and details may be made therein without departing from the spirit and scope of the invention. For example, although the Q-filter of FIG. 2 and FIG. 3 computes values for the q-measure in real-time, one of ordinary skill in the art will recognize that these measures may be obtained from pre-loaded memory. Additionally, the values for the density generator vector and the values for variable parameter λ may also be obtained from memory. FIG. 5 illustrates a data structure that can be used for efficient pre-computing, saving and accessing of the q-measure components, given a small widow of size n=5. Additionally when using the Q-filter with image data inputs, the input window will be a 2-dimensional array, so the array needs to be represented as a 1-dimensional vector before applying the filter. Higher dimensional inputs can be treated in a similar manner. It is intended that such changes come within the scope of the following claims. It is intended that such changes come within the scope of the following claims.

The invention claimed is:

1. A method for filtering a signal to produce a filtered signal, the method comprising the steps of:
    setting a value of a variable parameter λ;
    setting a density generator vector $f = \{f^1, f^2, \ldots, f^n\}$;
    constructing a q-measure based on the variable parameter λ and vector f; and
    producing a filtered signal by filtering the signal based on the q-measure.

2. The method of claim 1 wherein the step of constructing the q-measure comprises the step of additionally constructing the q-measure based on a measure generator function.

3. The method of claim 2 wherein the step of constructing the q-measure based on the measure generator function comprises the step of constructing the q-measure based on a normalized measure generator.

4. The method of claim 1 wherein the step of constructing the q-measure comprises the step of constructing the function $$q(A) = \begin{cases} \dfrac{\prod_{x_j \in A}(1+\lambda f^j) - 1}{\prod_{x_j \in X}(1+\lambda f^j) - 1}, & \lambda \geq -1, \lambda \neq 0 \\ \dfrac{\sum_{x_j \in A} f^j}{\sum_{x_j \in X} f^j}, & \lambda = 0 \end{cases}$$

5. The method of claim 1 wherein the step of setting the value of the variable parameter λ comprises the step of choosing a real value for λ that is greater than or equal to −1.

6. The method of claim 1 wherein the step of setting the density generator vector $f = \{f^1, f^2, \ldots, f^n\}$ comprises setting elements $f^j$ wherein $0 \leq f^j \leq 1$ for $j=1, \ldots, n$.

7. A filter for producing a filtered signal, the filter comprising:
    an input receiving a signal;
    an input receiving a variable parameter λ;
    an input receiving a density generator vector $f = \{f^1, f^2, \ldots, f^n\}$;
    logic circuitry and memory components required for constructing a q-measure based on the variable parameter λ and vector f and outputting a the filtered signal based on lie q-measure.

8. The filter of claim 7 wherein the q-measure is based on a measure generator.

9. The filter of claim 8 wherein the q-measure based on a normalized measure generator.

10. The filter of claim 7 wherein the q-measure for a given set A is set equal to q(A) wherein $$q(A) = \begin{cases} \dfrac{\prod_{x_j \in A}(1+\lambda f^j) - 1}{\prod_{x_j \in X}(1+\lambda f^j) - 1}, & \lambda \geq -1, \lambda \neq 0 \\ \dfrac{\sum_{x_j \in A} f^j}{\sum_{x_j \in X} f^j}, & \lambda = 0 \end{cases}$$

11. The filter of claim 7 wherein the variable parameter λ comprises a value that is greater than or equal to −1.

12. The filter of claim 7 wherein the density generator vector $f = \{f^1, f^2, \ldots, f^n\}$ comprises elements $f^j$ wherein $0 \leq f^j \leq 1, \ldots, n$.

* * * * *